(12) United States Patent
Thieme et al.

(10) Patent No.: US 8,114,526 B2
(45) Date of Patent: Feb. 14, 2012

(54) COMPOSITE SUBSTRATES FOR HIGH TEMPERATURE SUPERCONDUCTORS HAVING IMPROVED PROPERTIES

(75) Inventors: Cornelis Leo Hans Thieme, Westborough, MA (US); Elliott D. Thompson, Coventry, RI (US)

(73) Assignee: American Superconductor Corporation, Devens, MA (US)

( * ) Notice: Subject to any disclaimer, the term of this patent is extended or adjusted under 35 U.S.C. 154(b) by 923 days.

(21) Appl. No.: 12/061,421

(22) Filed: Apr. 2, 2008

(65) Prior Publication Data

US 2008/0274371 A1  Nov. 6, 2008

Related U.S. Application Data

(60) Provisional application No. 60/922,145, filed on Apr. 6, 2007.

(51) Int. Cl.
- B32B 15/01 (2006.01)
- B32B 15/02 (2006.01)
- B32B 15/16 (2006.01)
- B22F 7/02 (2006.01)
- H01B 12/06 (2006.01)

(52) U.S. Cl. ........ 428/655; 428/547; 428/641; 428/660; 505/239; 420/441

(58) Field of Classification Search .......... 505/230, 505/239, 431; 428/547, 610, 680, 655, 660; 148/426, 675, 676; 420/441; 419/5, 6, 36, 419/43

See application file for complete search history.

(56) References Cited

U.S. PATENT DOCUMENTS

| | | |
|---|---|---|
| 6,428,635 B1 | 8/2002 | Fritzemeier et al. |
| 6,458,223 B1 | 10/2002 | Hans Thieme et al. |
| 6,475,311 B1 | 11/2002 | Fritzemeier et al. |
| 2002/0076567 A1 | 6/2002 | Honjo et al. |
| 2005/0031890 A1 | 2/2005 | De Boer et al. |
| 2007/0269329 A1 * | 11/2007 | Zhou et al. .......... 419/6 |

FOREIGN PATENT DOCUMENTS

| | | |
|---|---|---|
| EP | 1 208 244 B1 | 12/2004 |
| JP | 2006286212 | * 10/2006 |

OTHER PUBLICATIONS

V. Subramanya Sarma, et al., "On the development of high strength and bi-axially textured Ni-3%W/N-10%Cr-1.5% Al composite substrate for coated conductor application," Scripta Materialia, vol. 48(8), (2003), pp. 1167-1171.

(Continued)

*Primary Examiner* — Stanley Silverman
*Assistant Examiner* — Kallambella Vijayakumar
(74) *Attorney, Agent, or Firm* — Occhiuti Rohlicek & Tsao LLP

(57) ABSTRACT

A composite substrate for superconductors and methods for making the same are described. The composite substrate of the present invention includes at least a core layer having and a sheath layer having a cube texture on at least a portion its surface. In certain embodiments, the core layer can include a nickel-tungsten-molybdenum alloy having about 2-10 atomic percent tungsten and 2-15 atomic percent molybdenum. In some embodiments, the sheath layer can include nickel or a nickel-tungsten alloy having about 0 to 6 atomic percent tungsten. Generally, the core layer is stronger than the sheath layer and an interdiffusion zone can exist between the core layer and the sheath layer.

19 Claims, 17 Drawing Sheets

OTHER PUBLICATIONS

V. Subramanya Sarma, et al., "Development for high strength and strogly cube textured Ni-4.5%W/Ni-15%Cr composite substrate for coated conductor application," Acta Materialia, vol. 51(16), (2003), pp. 4919-4927.

Y. Zhao, et al., "Fabrication of reinforced and biaxially textured NiW alloy substrates by spark plasma sintering technique," IEEE Trans. On. Appl. Supercond., vol. 17, (Jun. 2007) p. 3424.

Metals Handbook, Ninth Edition, vol. 7, "Powder Metallurgy," pp. 401-405 (Jun. 1984).

Jones, W.D., "Fundamental Principles of Powder Metallurgy," London, 1960, p. 924 (1960).

MacKay, M.L., Innovation in P/M: An Engine Bearing Material, Met. Prog. vol. 111(6), 1977, pp. 32-35.

Bhattacharjee et al., "Recrystallization textures of powder metallurgically prepared pure Ni, Ni-W and Ni-Mo alloy tapes for use as substrates for coated superconductors," Physica C, North-Holland Publishing, Amsterdam, NL, vol. 449(2): pp. 116-121 (Nov. 15, 2006).

International Search Report issued for PCT/US08/059133, dated Sep. 15, 2008.

Lenel, F.V., Powder Metallurgy: Principles & Applications; Metal Powder Industries Federation, Princeton, New Jersey, p. 164, 1980.

German, R.M., Powder Metallurgy Science; Metal Powder Industries Federation, Princeton, New Jersey, p. 118, 1984.

Sarma, V.S. et al., "Development of High Strength and Strongly Cube Textured Ni-5% W / Ni-10% W Composite Substrate Tapes for Coated Conductor Application," Trans. Indian Inst. Met. vol. 57(6): pp. 651-657 (Dec. 2004).

Shi, D.Q. et al., "YBCO coated conductor using biaxially textured clad composite Ni-Mn/Ni-Cr substrate," Supercond. Sci. Technol. 18: pp. 1405-1409 (2005).

Suo, HL, et al., "Preparation of Cube Textured Ni5W/Ni9W Composite Substrate for YBCO Coated Conductors," Manuscript submitted to College of Material Science, Beijing University: pp. 1-4 (Aug. 28, 2006).

* cited by examiner

COMPOSITE SUBSTRATES FOR HIGH TEMPERATURE SUPERCONDUCTORS HAVING IMPROVED PROPERTIES

CROSS-REFERENCE TO RELATED APPLICATION

This patent application claims the benefit of the filing date of U.S. Patent Application No. 60/922,145, filed on Apr. 6, 2007, the contents of which is incorporated by reference herein in its entirety.

INCORPORATION BY REFERENCE

All patents, patent applications and publications cited herein are hereby incorporated by reference in their entirety. The disclosures of these publications in their entireties are hereby incorporated by reference into this application in order to more fully describe the state of the art as known to those skilled therein as of the date of the invention described herein.

FIELD OF THE INVENTION

The present invention relates to substrates for high temperature superconductors. More particularly, the present invention relates to composite substrates for high temperature superconductors having properties, such as improved mechanical properties.

BACKGROUND OF THE INVENTION

High Temperature Superconductors (HTS) have gained tremendous importance for their ability to provide improved current leads, improved transmission lines, improved magnetic windings, as well as uses in numerous other electrical conductor applications. One technique for fabricating a superconducting wire or tape is to deposit a superconducting film on a biaxially textured metallic substrate. The deposition of the superconducting layer on a biaxially textured metallic substrate can lead to the formation of textured superconducting layers that have improved superconducting properties. Although the currently utilized biaxially textured metallic substrates exhibit numerous advantageous properties, there is currently a need for continued improvements (such as improved mechanical and magnetic properties) of the biaxially textured substrates.

SUMMARY OF THE INVENTION

A composite substrate for superconductor articles is described. The composite substrate has a first layer that includes a metal or a metal alloy having a cube texture on at least a portion of its surface; and a second layer that includes a nickel-tungsten-molybdenum alloy containing about 2 to 10 atomic percent tungsten and 2 to 15 atomic percent molybdenum. The nickel-tungsten-molybdenum alloy has a higher yield strength than the metal or metal alloy of the first layer.

In certain embodiments, the composite substrate can further include a third layer where the second layer is between the first and third layers. The third layer can also include a metal or a metal alloy contained in the first layer and can also optionally have a cube texture on at least a portion of its surface.

In some embodiments, the composite substrate includes a first layer comprising nickel or a nickel-tungsten alloy having a cube texture on at least a surface of said first layer and having about 0 to 6 atomic percent tungsten; a second layer comprising a nickel-tungsten-molybdenum alloy having about 2-10 atomic percent tungsten and about 2-15 atomic percent tungsten; and an interdiffusion zone between the first layer and the second layer.

In other embodiments, the composite substrate may have a yield strength measured at 0.02% yield strain that is greater than 30% of the yield strength of a Ni-5 at % W layer measured at 0.02% yield strain.

Methods for making the composite substrates of the invention are also described. The method includes feeding a first metal powder from a first compartment and a second metal powder from a second compartment to adjacent regions at a nip of at least two rollers; compacting the first metal powder and the second metal powder using at least two rollers to form a compacted green body having a first compacted region that includes the first metal powder and a second compacted region that includes the second metal powder; heating the compacted green body to form a composite substrate having a first layer and a second layer; and developing a cube texture on at least a surface of said first layer.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
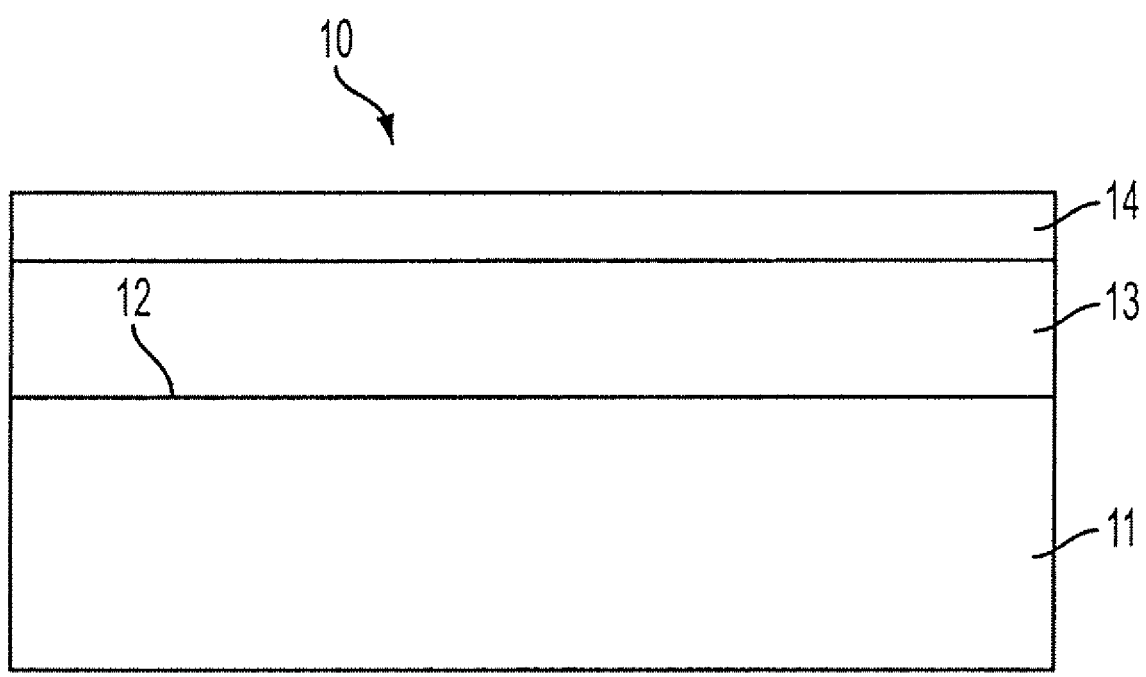
FIG. 1 is a diagram of a high temperature superconductor (HTS) article having at least one biaxially-textured substrate 11 with biaxially-textured surface 12, at least one epitaxial buffer layer with biaxially-textured surface, 13, and a top layer of epitaxial, in-plane aligned superconducting layer of a rare earth-alkaline earth-transition metal oxide superconductor (RE-123) 14.

As shown in FIG. 1, high temperature superconductor (HTS) articles such as 10, particularly in the form of wires or tapes, can generally include substrate 11 with at least one textured surface 12, at least one epitaxially deposited buffer layer 13, and a top layer of epitaxially deposited or epitaxially grown in-plane aligned superconducting layer of a rare earth-alkaline earth-transition metal oxide superconductor (RE-123) 14.

Layer 14 can be an in-plane aligned superconducting layer of RE-123 (e.g., YBCO). For example, YBCO can be biaxially textured wherein the c-axis of the orthorhombic crystal cell is parallel to the thickness direction of the HTS article and the ab-plane is perpendicular to the thickness direction of the HTS article. Or stated in a different way, the c-axis is perpendicular to the plane of the YBCO film and ab-plane is in the plane of YBCO film.

Buffer layer(s) 13 can be an epitaxial buffer layer and can be made of metal oxides, such as $LaAlO_3$, $Y_2O_3$, $CeO_2$, or yttria-stabilized zirconia (YSZ). Buffer layer(s) 13 can be a buffer to oxygen diffusion and reduce oxidation of the substrate 11. Buffer layer(s) 13 can also serve as chemical barriers between substrate 11 and the layer 14. Moreover, the buffer layer(s) 13 can have a coefficient of thermal expansion that is well matched with the superconductor material of layer 14.

Substrate 11 can be fabricated over long lengths and large areas and can be made of a metal such as nickel (Ni) or Ni alloys and can provide flexibility for the article. For example, Ni alloys having about 4 to 5 atomic percent (at %) tungsten (W) are commonly utilized as substrate 11. Substrate 11 can be formed using, for example, Rolling Assisted Biaxially Textured Substrates (RABiTS) process, which is described more fully in U.S. Pat. No. 5,471,377 (hereinafter "the '377 patent"), the contents of which are incorporated by reference herein in its entirety. In short, RABiTS are produced by deforming a strip of metal or metal alloy between two or more rollers and allowing the strip to undergo plastic deformation leading to the development of a textured strip reduced in thickness. As described in the '377 patent, substrate 11 can develop different textures depending on the composition of the alloy, the processing history, and the like. Generally, cube or brass textures are most commonly observed.

In a cube texture, the (100) atomic plane of the cube (the (100) plane) lies parallel to the plane of the substrate and a cube edge (the <001> direction) is generally parallel to the rolling direction. In short notation, such a cube texture is also commonly identified as (100)<001>. In a brass texture, the (110) plane lies parallel to the plane of the substrate and the <112> direction is generally parallel to the rolling direction. Generally, a biaxial texture resembles grains of single crystals that are in slightly different orientations with each other.

Ni-5 at % W substrates, in particular, exhibit excellent cube texture and a 0.02% yield stress of about 180 MPa at room temperatures and about 250 MPa at about 77K (operating temperature). However, higher strength can increase process stability and allow reduction in thickness. Substrates having excellent texture, higher mechanical strengths, and/or exhibiting ferromagnetic loss reduction are described. The improved substrates can be easily manufactured at long lengths desired for current carrying applications.

Figure 2:
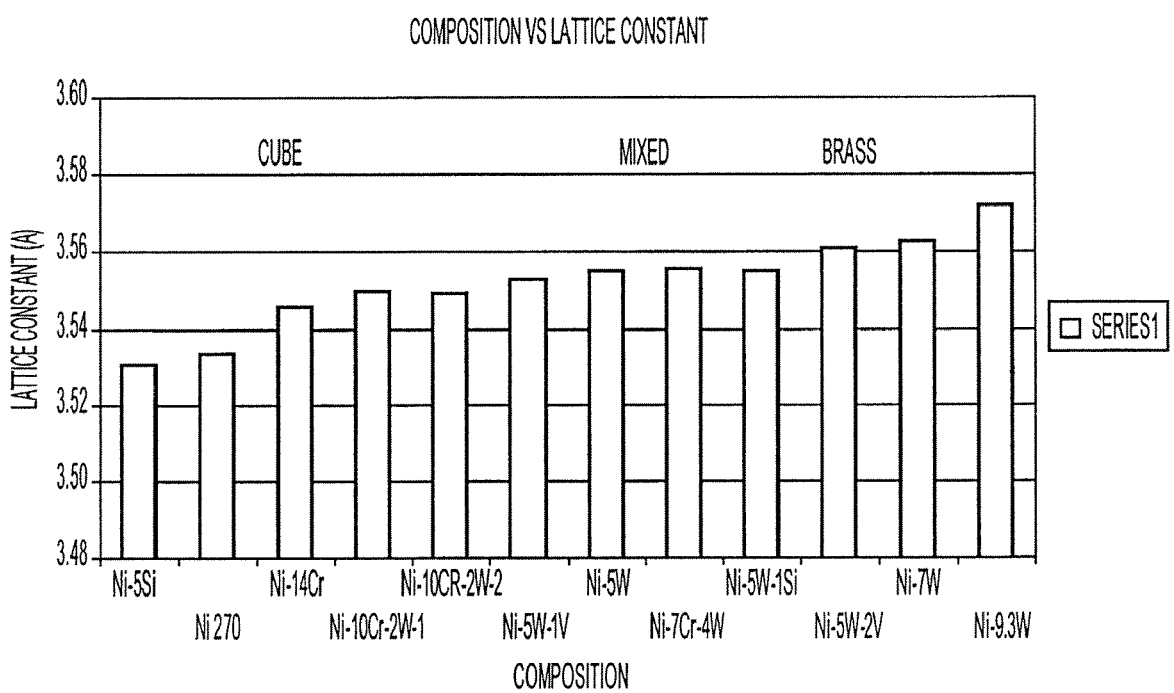
FIG. 2 shows a graph of different nickel alloy rolling assisted biaxially textured substrates (RABiTS) that tend to form particular textures in accordance with certain embodiments of the present invention.

FIG. 2 shows a graph of different nickel alloys RABiTS that tend to form particular textures. Certain metals and metal alloys, such as Ni270 (pure Ni), Ni-5 at % W, Ni-14 at % Cr, Ni-10 at % Cr-2 at % W, Ni-5 at % W-1 at % V, tend to form a cube texture during RABiTS processing. Other alloys, such as Ni-7 at % W and Ni-9.3 at % W, tend to form brass texture when processed. Yet other alloys, such as Ni-7 at % Cr-4 at % W and Ni-5 at % W-1 at % Si, tend to form mixed texture with about 70-80% cube texture. Although not wishing to be bound by theory, some generalized trends can be observed from FIG. 2. As shown, alloys having larger lattice constants may tend to form brass textures while alloys having smaller lattice constants may tend to form the desired cube texture.

Figure 3:
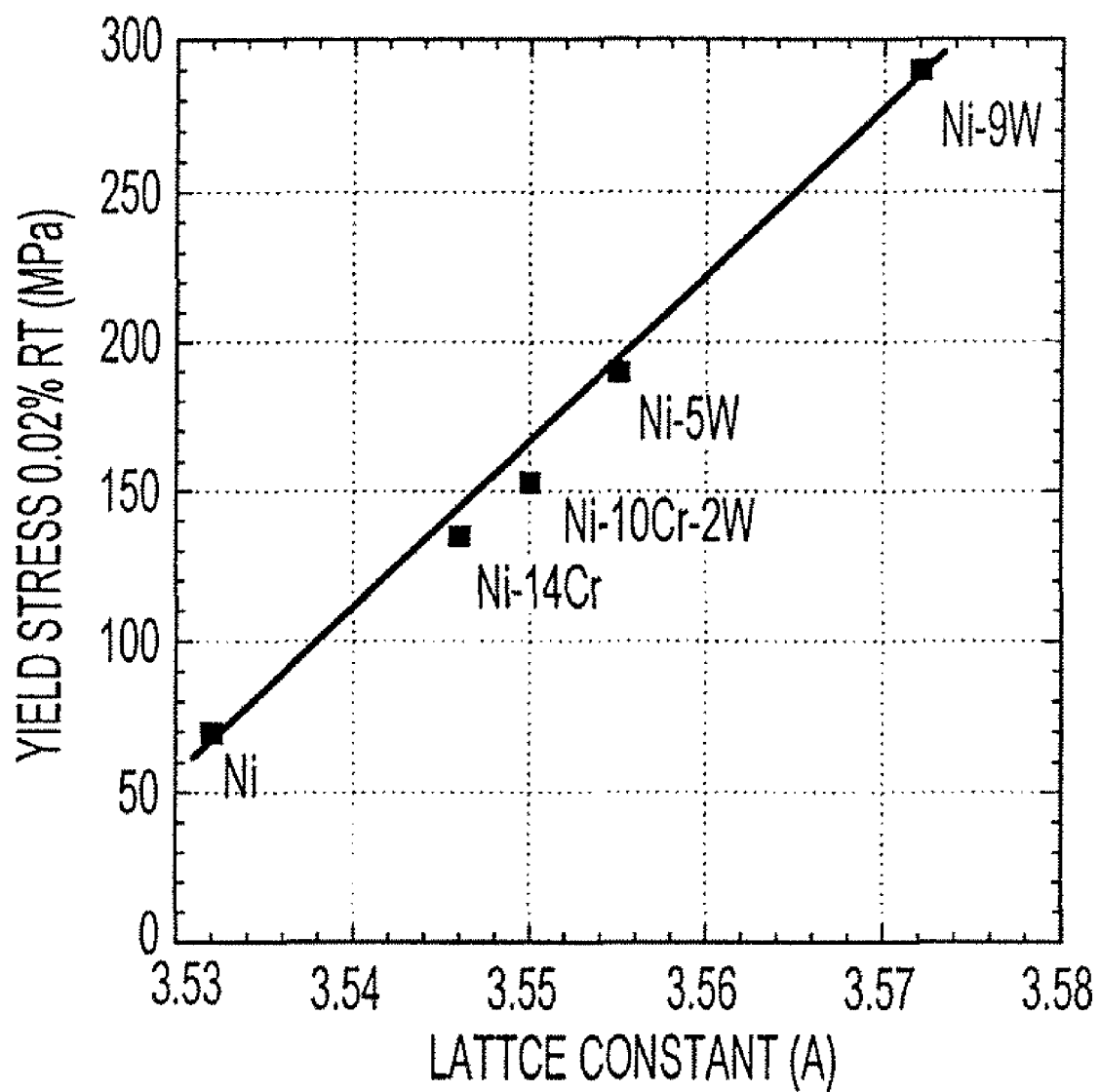
FIG. 3 shows a graph of lattice constant of various nickel alloys (as measured from their respective (200) reflections) as a function of their mechanical properties in accordance with certain embodiments of the present invention.

However, as shown in FIG. 3, alloys having larger lattice constant also may tend to have stronger mechanical properties. For example, Ni-9 at % W alloy exhibits about 290 MPa yield stress at 0.02% strain (room temperature) while Ni-5 at % W alloy exhibits only about 190 MPa yield stress at 0.02% strain (room temperature). As a trade-off between the two desired properties is required, development of suitable alloys having the desired texture with superior mechanical properties remains a difficult problem.

Figure 4A:
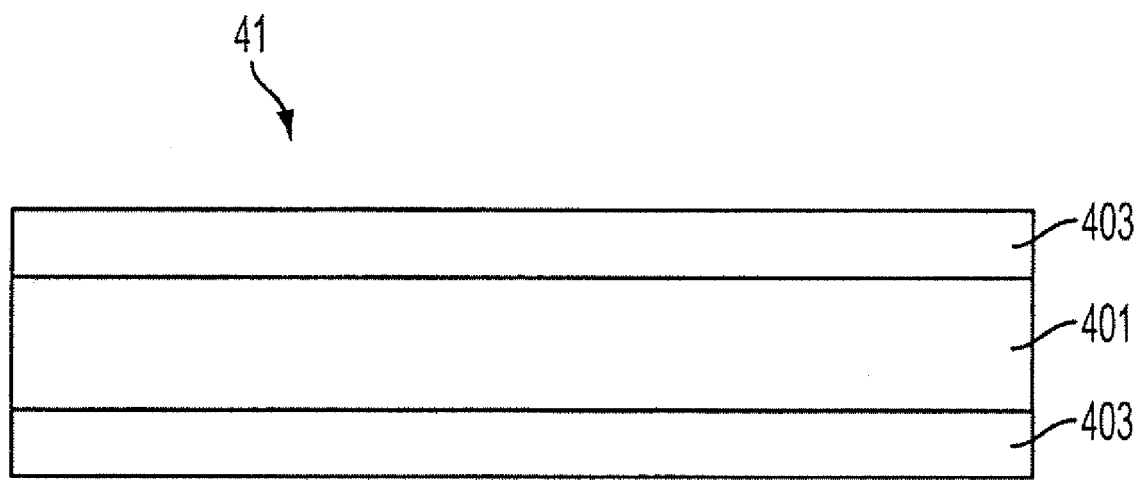
FIGS. 4A and 4B show composite substrates 41 having a core 401 and at least one sheath 403 in accordance with certain embodiments of the present invention.
Figure 4B:
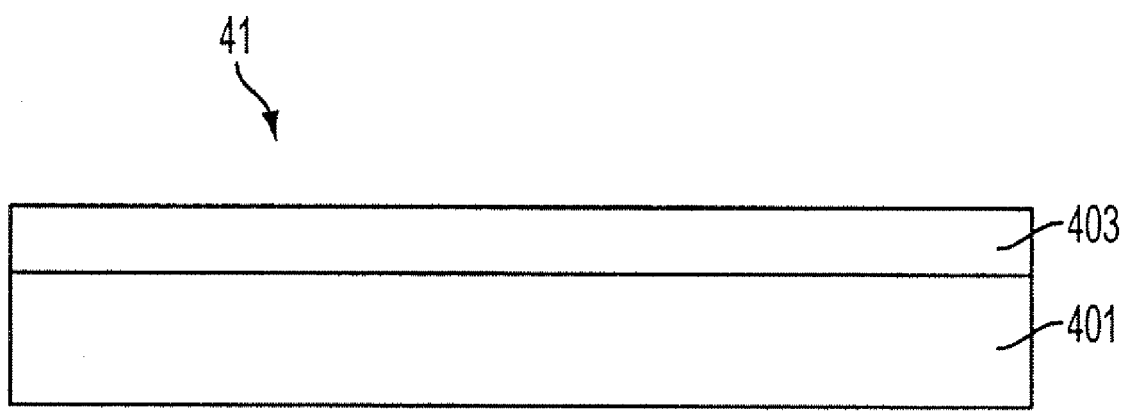

A composite substrate is described with reference to FIGS. 4A and 4B. A composite substrate 41 includes core 401 and a sheath 403. Core 401 is formed with an alloy having mechanical properties that are superior to the sheath 403. The composite substrate 41 may be in the form of a bilayer (sheath—core), as illustrated in FIG. 4B or a trilayer (sheath—core—sheath) structure, as illustrated in FIG. 4A. In certain embodiments, sheath(s) 403 form(s) cube texture on at least a portion of the surface upon rolling. In some embodiments, the composite substrate 41 has a yield stress that is about 30%-200%, e.g., at least 30%, 40%, 50%, 75%, 100%, 150%, or even 200%, greater than the yield stress of a Ni-5 at % W alloy having a cube texture. Other suitable composite substrate 41 structures will be readily apparent to one of ordinary skill in the art.

In some other embodiments, composite substrate 41 may exhibit a magnetic permeability that is about 2-10 times, e.g., at least 2, 3, 4, 5, 6, 7, 8, 9, or even 10 times, smaller than the permeability of a Ni-5 at % W alloy having a cube texture. In certain embodiments, composite substrate 41 of the present invention may have permeability values that are significantly lower than that of a Ni-5 at % W alloy having a cube texture while the loss per cycle remain similar or lower.

Core 401 can make up about 50%-90%, e.g., at least 50%, 60%, 70%, 80%, or 90%, of the total thickness of the composite substrate 41. For example, when the composite substrate 41 is in a trilayer structure, core 401 may include about 60% of the total thickness and each sheath 403 may independently include about 10%-30%, e.g., about 10%, 15%, 20%, 25%, and 30%, of the total thickness of the structure. As another example, when the composite substrate 41 is in a bilayer structure, core 401 may include about 70%-90%, e.g., about 70%, 80%, or 90%, of the total thickness and the sheath 403 may include about 10%-30%, e.g., about 30%, 20%, or 10%, of the total thickness of the structure.

In certain embodiments, metal alloys of core 401 and sheath 403 may include metal constituents that are desirably resistant to oxidation during processing and/or operation and lead to reduced magnetic properties. Additional consideration may include availability/cost of metal powders, purity of metal powders, size of metal powders, polydispersity of metal powders, and the like when a powder metallurgical approach to processing is used.

Core 401 may include alloys that have superior mechanical properties as compared to sheath 403. For example, core 401 may include alloys having a yield stress of about 250 MPa-500 MPa, e.g., at least 250, 275, 300, 325, 350, 375, 400, 450, or 500 MPa, at about 0.02% strain (either room temperature and/or operating temperatures). In certain embodiments, core 401 may include constituents that lead to high degree of twinning during processing. Suitable alloys include nickel-tungsten alloys, nickel-tungsten-transition metal alloys, and commercial nickel alloys such as, for example, Haynes C276 or C22, and the like. Exemplary transition metals that can be utilized in nickel-tungsten-transition metal alloys include Ti, Y, Hf, V, Zr, Ta, Cr, Nb, Mo, Co, Cu, and Pd. In some embodiments, core 401 may be capable of being rolled to high reductions (well over 90% reduction in thickness). Some exemplary alloys may include nickel-tungsten alloys having about 7-12 at % tungsten, nickel-tungsten-molybdenum alloys having about 2-10 at % tungsten and about 2-15 at % molybdenum, nickel-tungsten-chromium alloys having about 5-12 at % tungsten and about 4-15 at % chromium. For example, suitable alloys may be Ni-9.5 at % W,
Ni-10 at % W,
Ni-5 at % W-6 at % Mo,
Ni-6 at % W-6 at % Cr,
and the like.

Core 401 may include additional constituents, such as metal powders. For example, when core 401 is a Ni(W,Mo) alloy, core 401 may contain powders of W and/or Mo. Without wishing to be bound by theory, the metal powders may provide additional strength and stiffness to core 401, beyond the solid solution strengthening obtained by the alloys described above. In certain embodiments, the metal powders may form an interface that adheres well with the surrounding alloy. For example, in a Ni(W,Mo) alloy core, core 401 can contain particles of Ni W and/or Mo dispersed throughout a Ni(W,Mo) alloy, where the particles form a compositionally gradual interface transitioning from the alloy to the W or Mo particles that adheres well to the surrounding alloy.

Sheath 403 is an alloy capable of forming a cube texture upon rolling of the composite substrate 41. That is, after rolling and a final anneal of the rolled substrate, the surface of the sheath has a sharp cube texture, with an in-plane texture δφ FWHM value of less than 10°, preferably less than 8°, and a cube texture percentage of more than 90%. In certain embodiments, sheath 403 may include constituents that enhance the stacking fault energy of the sheath alloy. For example, certain amounts of Cr, W, and/or V can be added to Ni or Al can be added to Cu to reduce the stacking fault energy that still allows the formation of a cube texture without transitioning into a brass texture. Suitable metals or metal alloys may include nickel, nickel-tungsten alloys, pure Ni such as Ni270, nickel-chromium alloys, nickel-chromium-tungsten alloys, nickel-tungsten-vanadium alloys, nickel-vanadium alloys, nickel-copper alloys, nickel-copper-aluminum alloys, copper-aluminum alloys, and the like. Some exemplary alloys may include nickel-tungsten alloys having 0-6 at % tungsten, nickel-chromium alloys having about 0-15 at % chromium, nickel-chromium-tungsten alloys having about 0-15 at % chromium and 0-6 at % tungsten, nickel-tungsten-vanadium alloys having about 0-6 at % tungsten and about 0-10 at % vanadium, copper-aluminum alloys having less than about 1 at % aluminum, and the like. For example, suitable metals or metal alloys may include Ni,
Ni-1 at % W,
Ni-2 at % W,
Ni-3 at % W,
Ni-4 at % W,
Ni-5 at % W,
Ni-6 at % W,
Ni-14 at % Cr,
Ni-10 at % Cr-2 at % W,
Ni-5 at % W-1 at % V,
Cu-50 at % Ni-1.5 at % Al,
and the like.

In certain embodiments, an interdiffusion zone may exist between core 401 and sheath 403 where certain atomic constituents from core 401 and sheath 403 may have diffused into sheath 403 and core 401, respectively. For example, if core 401 includes a metal alloy having three constituents (metals A, B, and C) and sheath 403 includes a metal alloy having two constituents (metals A and B), the third constituent (metal C) in core 401 may diffuse a distance into sheath 403 thereby forming an interdiffusion zone. In some embodiments, the thickness of sheath 403 is sufficient to provide a texture for subsequent deposition of a superconducting material on the sheath 403 without being affected by the crystal structure or texture of the interdiffusion zone. While not wishing to be bound by theory, such an interdiffusion zone may be beneficial in promoting adhesion between core 401 and sheath 403 and increasing the mechanical properties of composite substrate 41.

Composite substrates 41 can be made in using a variety of different methods. For example, composite substrates 41 can be made using a batch process or a continuous process.

Composite substrates 41 can be made using co-extrusion, in which a tube or other hollow structure (made of the metal or metal alloy for sheath 403) is filled with a core material, and extruded to form a composite strip or bar, as described in V. Subramanya Sarma, B. de Boer, J. Eickemeyer, B. Holzapfel, "On the development of high strength and bi-axially textured Ni-3% W/Ni-10% Cr-1.5% Al composite substrate for coated conductor application," Scripta Materialia, Vol. 48(8), (2003), pp. 1167-1171 and V. Subramanya Sarma, J. Eickemeyer, A. Singh, L. Schultz, B. Holzapfel, "Development of high strength and strongly cube textured Ni-4.5% W/Ni-15% Cr composite substrate for coated conductor application," Acta Materialia, Vol. 51(16), (2003), pp. 4919-4927, both of which are incorporated by reference herein in its entirety. The composite strip is further rolled to consolidate and densify the core material and to develop a cube texture on the surface of the sheath layer. After rolling, a composite foil results.

Composite substrates can also be made using a cladding process, in which two or three strips, one being the core material, and one or two being the sheath material, are bonded in a rolling operation, as described in Y. Zhao, H. L. Suo, M. Liu, D. He, Y. X. Zhang, R. Fan, L. Ma, M. L. Zhou, "Fabrication of reinforced and biaxially textured NiW alloy substrates by spark plasma sintering technique," IEEE Trans. On Appl. Supercond., Vol. 17, (2007) p. 3424, which is incorporated by reference herein in its entirety. This cladding process is a common commercial process for making composite foils. The constituent starting strips are made the usual way, using casting, hot rolling and cold rolling to strip, or other commercial processes to make metal strip. Clad products can also be made in batch or longer length using explosive welding or friction welding.

In certain embodiments, powder metallurgy processing methods can be utilized to fabricate composite substrate 41 of the present invention. An exemplary powder metallurgy processing method is described with reference to FIG. 5. In step 501 of FIG. 5, suitable elemental metal powders are mixed at appropriate atomic or weight proportions to obtain the desired metal alloy composition after powder consolidation and heat treatment. In certain embodiments, each constituent metal powders may each have about 95%-100%, e.g., at least 95%, 97%, 98%, 99%, 99.5%, 99.9%, 99.95%, purity. In some other embodiments, each constituent metal powders may have particle diameters of about 0.1-10 micrometers, e.g., up to 10, 5, 2, 1, 0.1 micrometers. In yet some other embodiments, metal powders may have a range of particle sizes to promote more efficient compacting during step 503. Moreover, each metal powder may have a range of particle sizes to obtain metal particles dispersed throughout core 401. Powders may be mixed using any appropriate methods such as stirring, shaking, blending, and the like.

Figure 5:
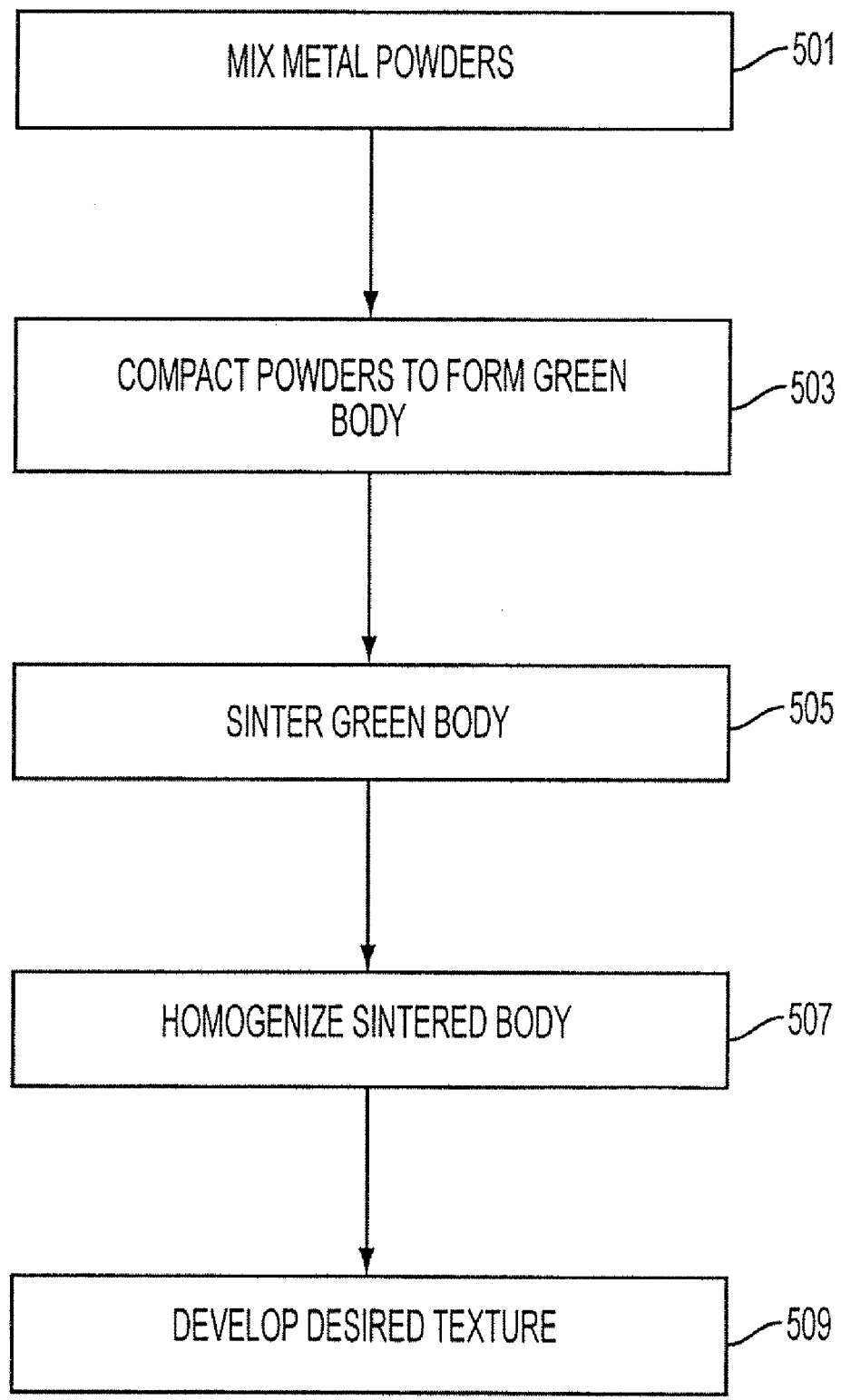
FIG. 5 shows a method for making a composite substrate in accordance with certain embodiments of the present invention.

As shown in step 503 of FIG. 5, the mixed powders may be compacted to form a green body having a desired composite substrate structure in any suitable method. For example, the mixed powders may be compacted using a compression molding machine, a press machine, using two or more rollers, and the like. For example, compaction can be carried out from about 10 to 50 tons per square inch at room temperature or higher.

An exemplary batch process is shown in step 505 of FIG. 5, where the compacted green body may be sintered to further promote bonding of the powders and form the alloy. For example, the compacted green body may be sintered at about 1000° C. to about 1400° C. at about 10 to 300 millitorr pressure for about 0.1 to 10 hours.

At step 507 of FIG. 5, the pre-sintered structure may be homogenized at elevated temperature(s) for a desired amount of time to aid in formation of alloy and/or to improve alloy homogeneity and density in each layer of the composite structure. For example, pre-sintered nickel alloy composite structure may be homogenized at temperatures of about 1000-1400° C. for about 5-200 hrs. In certain embodiments, the oxygen partial pressure can be lowered to prevent oxidation of the alloying elements. For example, oxygen partial pressure can range from about $10^{-6}$ to about $10^{-12}$ atmospheres.

In certain embodiments, the homogenization can be carried out to obtain metal particles dispersed through the alloy. For example, in a Ni(W,Mo) alloy core, core 401 can be made using powders that include Ni, W, and Wo metal particles, where a certain percentage of smaller W and/or Mo particles (e.g., average diameter of 5 microns) and a certain percentage of larger W and/or Mo particles (e.g., average diameter of 100 microns) were compacted and optionally sintered. The homogenization can then be carried so that smaller W and/or Mo particles react with Ni to form a dense Ni(W,Mo) alloy, while the larger particles remain partially uncoverted and embedded in the Ni(W,Mo) alloy solution, leading to a compositionally gradual interface that adheres well to the surrounding alloy.

At step 509 of FIG. 5, the homogenized composite structure can be processed to develop a desired texture on at least the surface of the sheath layer(s). For example, the homogenized composite structure can be processed using two or more rollers for compaction, as discussed below.

It should be noted that additional steps may be carried out in addition to the steps described in FIG. 5. Furthermore, some of the steps described in FIG. 5 may be omitted as desired and/or suitable. Such modifications will be readily apparent to one of ordinary skill in the art and are within the scope of the invention.

Figure 6A:
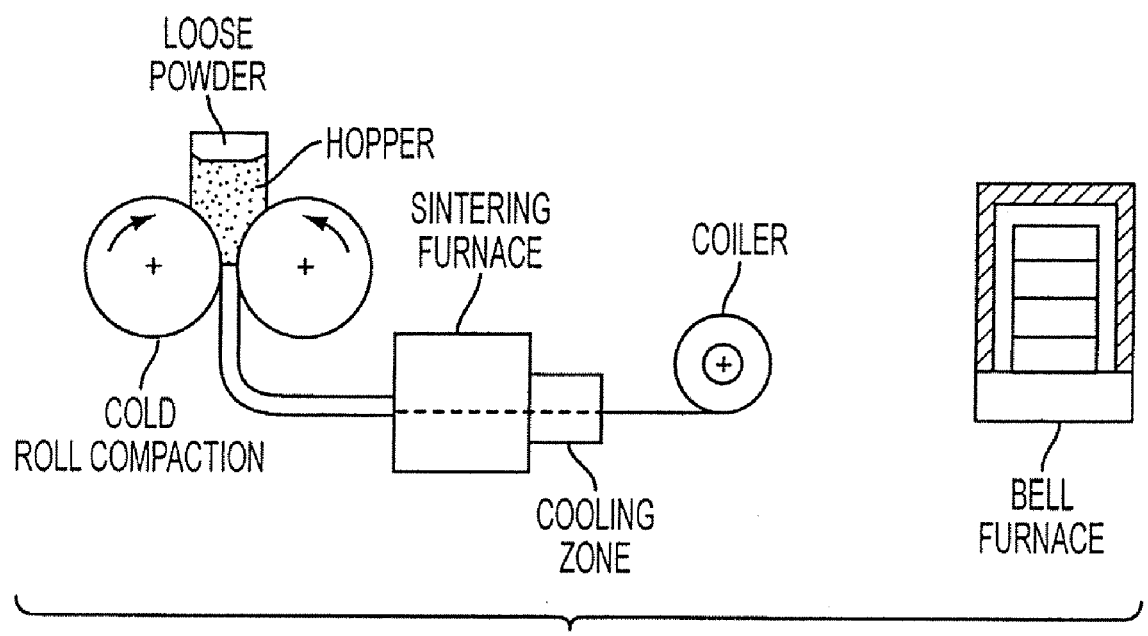
FIGS. 6A through 6C show a roll compacting apparatus that can be utilized to make composite substrates in accordance with certain embodiments of the present invention.
Figure 6B:
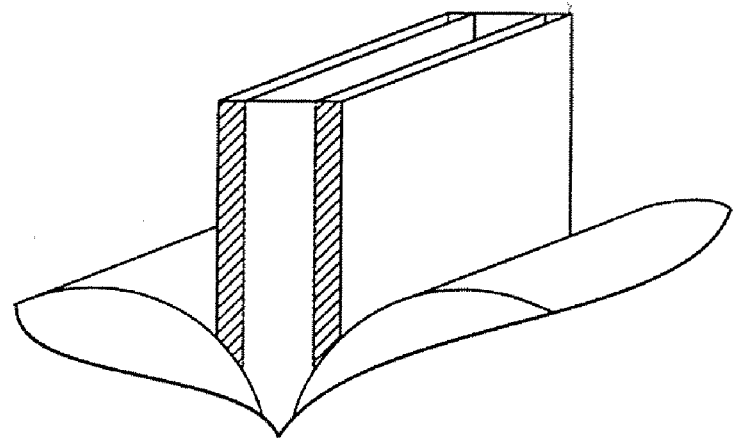
Figure 6C:
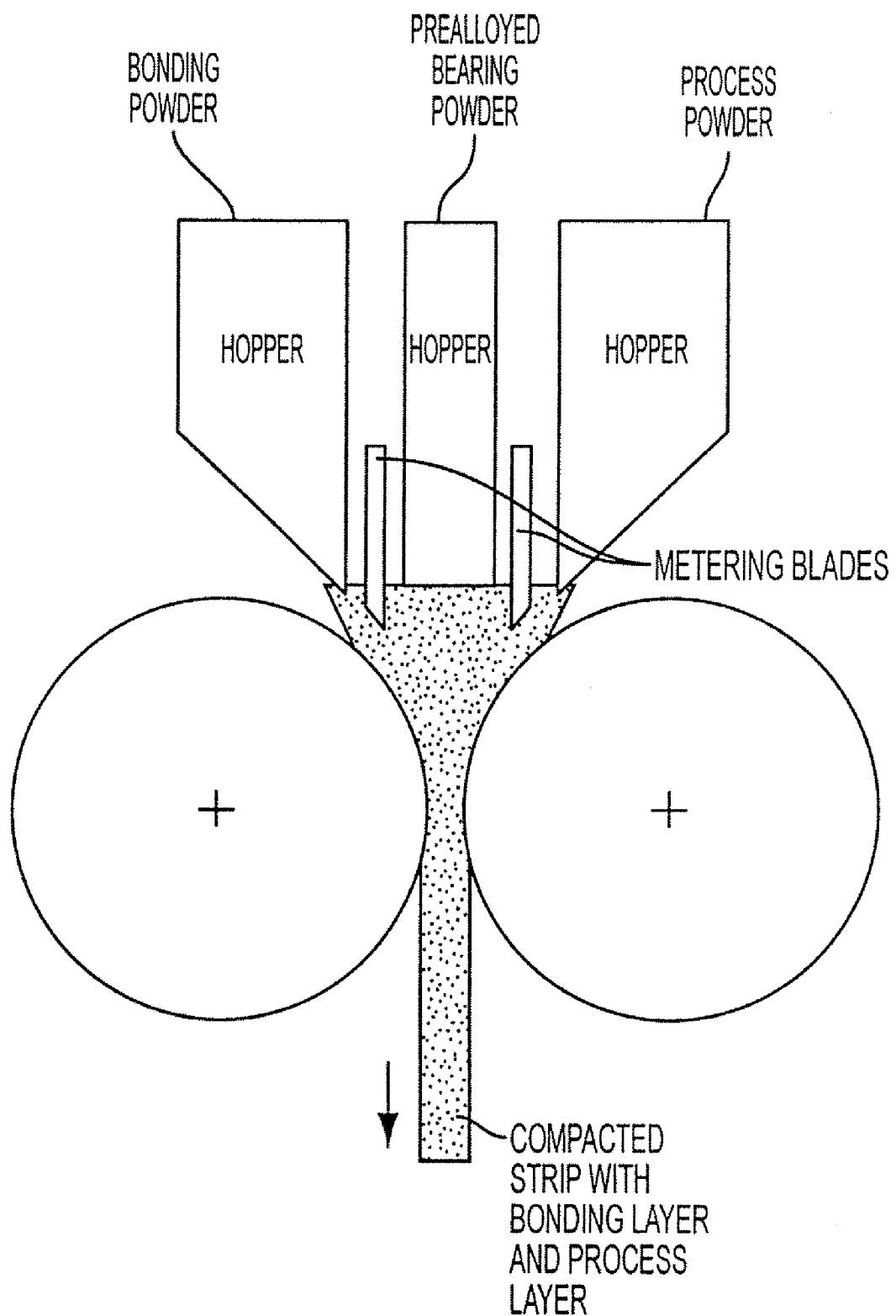

In certain embodiments, steps 503 through 509 can be carried out using a roll compacting (or powder rolling) process as described in the *Metals Handbook, Ninth Edition*, Volume 7, "Powder Metallurgy," pages 401-405 and Jones, W. D., "Fundamental Priciples of Powder Metallurgy," London, 1960, p. 924, the contents of which are incorporated herein in their entireties. FIG. 6A shows an exemplary roll compacting apparatus that can be utilized in the present invention. As shown, powders mixed in step 501 can be fed from a specialized hopper (see, e.g., FIGS. 6B and 6C which show specialized hoppers to form a trilayer composite substrate) to a set of compacting rolls to produce a continuous green (unsintered) strip or sheet (step 503). (See MacKay, M. L., "Innovation in P/M: An Engine Bearing Material, Met. Prog. Vol. 111 (6), 1977, pp. 32-35, contents of which are incorporated by reference herein in its entirety.)

The compacted green strip or sheets may be sintered and/or homogenized in, for example, a sintering furnace and/or a Bell furnace shown in FIG. 6A (steps 505 and/or 507). Typically, for Ni alloys, sintering can be carried out in a furnace at the outlet of a powder compaction mill at about 800-1100° C. for about 5 and 20 minutes. Homogenization, carried out for formation of the solid solution Ni alloy (for example, a solid solution Ni-5W), can be carried out at about 1000-1400° C. for about 5 to 100 hrs or longer. To avoid oxidation, homogenization can be carried out under reducing conditions, such as pure hydrogen, or hydrogen mixed with argon or nitrogen.

In certain embodiments, the sintered and/or homogenized strip or sheet can be re-rolled to develop a desired texture at least on the surface of sheath layers.

In yet other embodiments utilizing a rolling mill to compact the powders, pre-alloyed powders can be used. Such pre-alloyed powders can be made with an atomization process such as water or gas atomization, or rotating electrode process, or rotating crucible atomization, or other processes used by those skilled in the art. Size of such pre-alloyed powders can range from about 20 microns to about several hundreds of microns.

EXAMPLE 1

Figure 7:
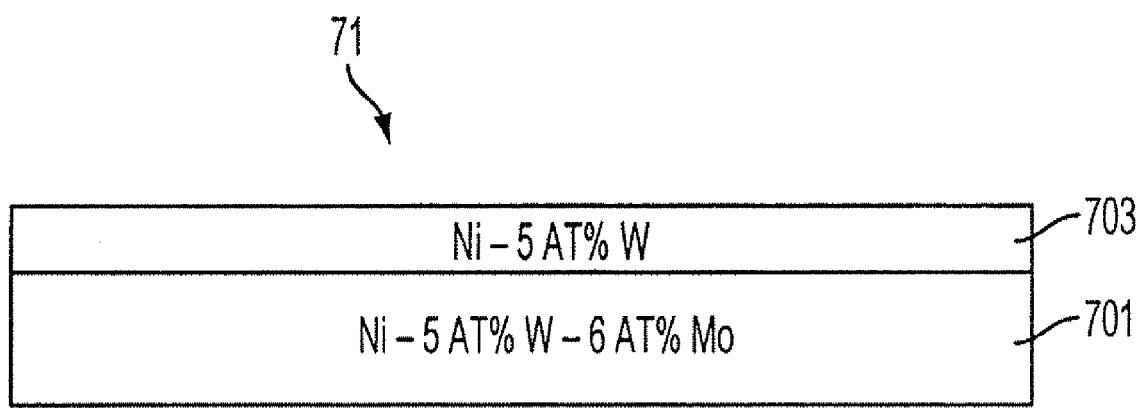
FIG. 7 shows a composite substrate 71 having Ni-5 at % W alloys as sheath 703 and Ni-5 at % W-6 at % Mo as core 701 in accordance with certain embodiments of the present invention.

Composite substrate 71 having core 701 and sheath 703 (see FIG. 7) was made as described below. Ni-5 at % W alloys were utilized for sheath 703 and Ni-5 at % W-6 at % Mo were utilized as core 701. Elemental Ni, W, and Mo metal powders corresponding to the compositions for core 701 and sheath 703 were weighed and mixed in a V blender for a sufficient time to insure uniform mixing. The metal powders were below 10 microns and had an average particle size of 2 microns.

Figure 8:
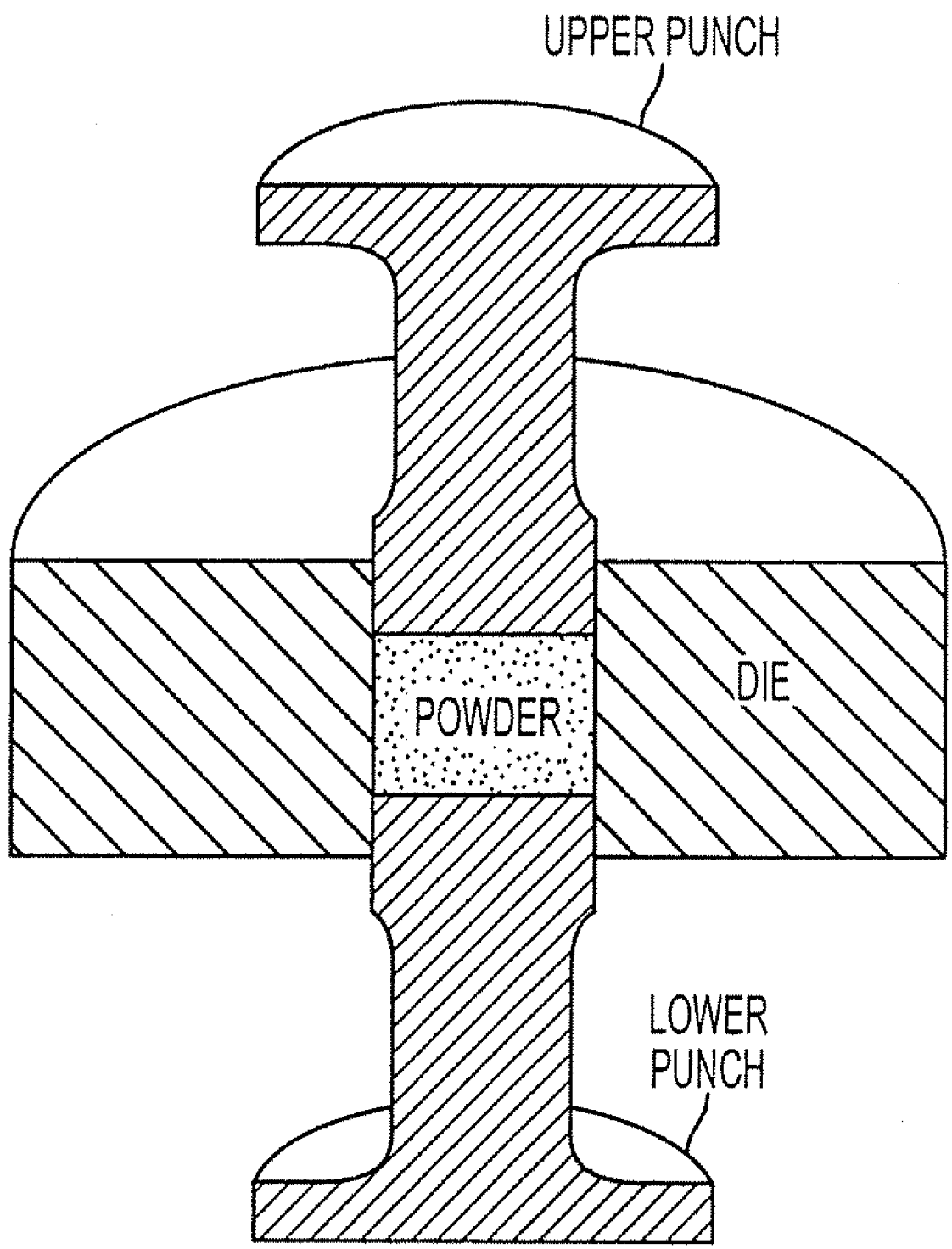
FIG. 8 shows a diagram of a rectangular die mounted on a dual acting press that can be used to make the composite substrates in accordance with certain embodiments of the present invention.

Mixed powders for composite substrate 71 were loaded into a 1.5 inches by 6.3 inches rectangular die mounted on a dual acting press as shown in FIG. 8. Mixed powders for core 701 corresponding to about 80% of the total thickness of the composite substrate 71 and mixed powders for sheath 703 corresponding to about 20% of the total thickness of the composite substrate 71 were loaded into the rectangular die.

The powder mixtures were then compressed at 30 tons per square inch. The compacted green body was ejected and sent for sintering. The green body had a density of about 6.58 g/cc.

The sintering/homogenizing was carried out in two steps. The first step was carried out at 150° C. at a pressure of 200 millitorr in flowing argon containing 5% hydrogen gas for 5 hours. This step removed any organics that may be present in the compacted green body. In the second step, the compacted green body was heated to 1150° C. at 60° C. per hour and held for 50 hours. This step was also carried out at a pressure of 200 millitorr in flowing argon containing 5% hydrogen gas. After sintering, a solid bar with a density of from 80 to 90% of the density of wrought material of the same composition was obtained.

Next, the sintered/homogenized bilayer was rolled to 1.27 mm on a two high rolling mill. The 1.27 mm thick strip was then transferred to a four high rolling mill and rolled to a foil with a thickness of about 70 microns to form composite substrate 71.

The foils were cut into samples which were annealed at 1150° C. in flowing argon containing 5% hydrogen gas, at atmospheric pressure, for up to about 30 minutes to develop the desired cube texture. The surface of the sheath layer showed a sharp cube texture with a FWHM of about 7°.

Figure 9:
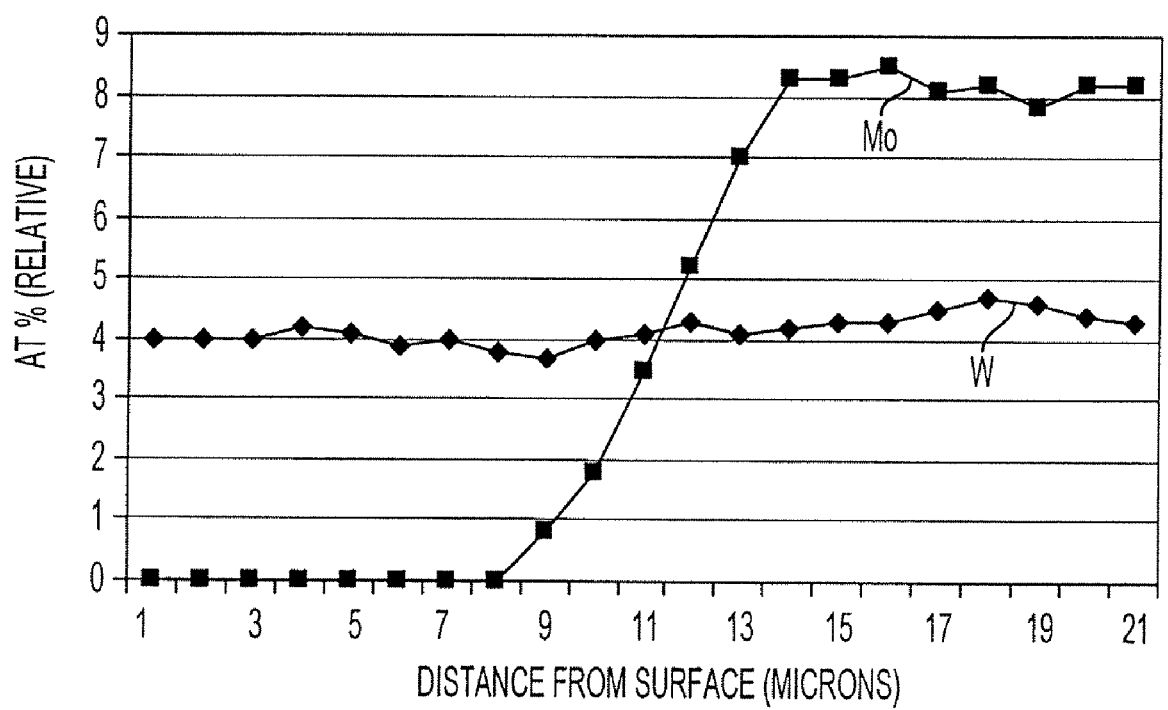
FIG. 9 shows an energy dispersive X-ray analysis (EDS) of composite substrate 71 of FIG. 7 in accordance with certain embodiments of the present invention.

The final thickness of the composite substrate 71 was about 70 μm. FIG. 9 shows an energy dispersive X-ray analysis (EDS) showing about 7 μm unconverted Ni-4 at % W sheath layer and about 7 μm interdiffusion zone. Core 701 was about 55 μm thick and contained grains of about 50 microns and heavily twinned crystals.

Figure 10A:
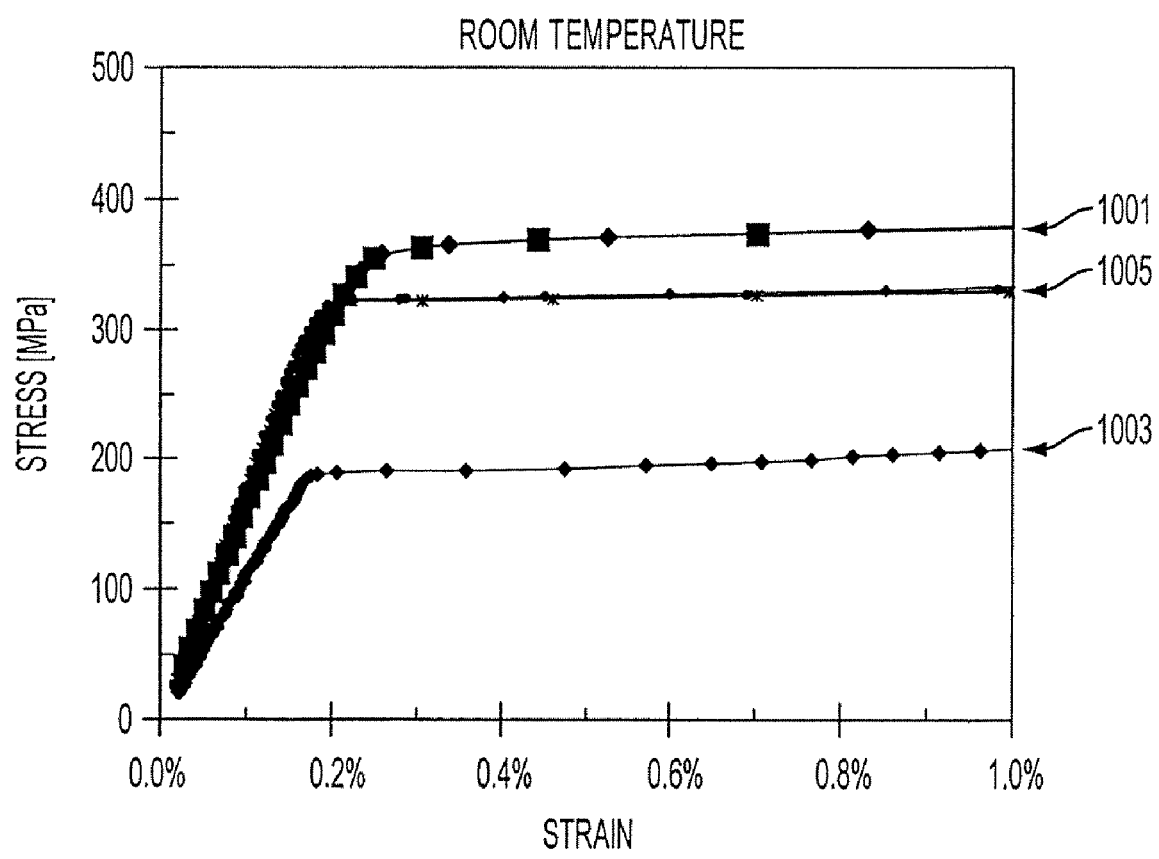
FIGS. 10A and 10B show exemplary stress-strain curves of the composite substrate 71 of FIG. 7, a single layer Ni-5 at % W, and a single layer Ni-9 at % W substrates at room temperature and at about 77 K in accordance with certain embodiments of the present invention.
Figure 10B:
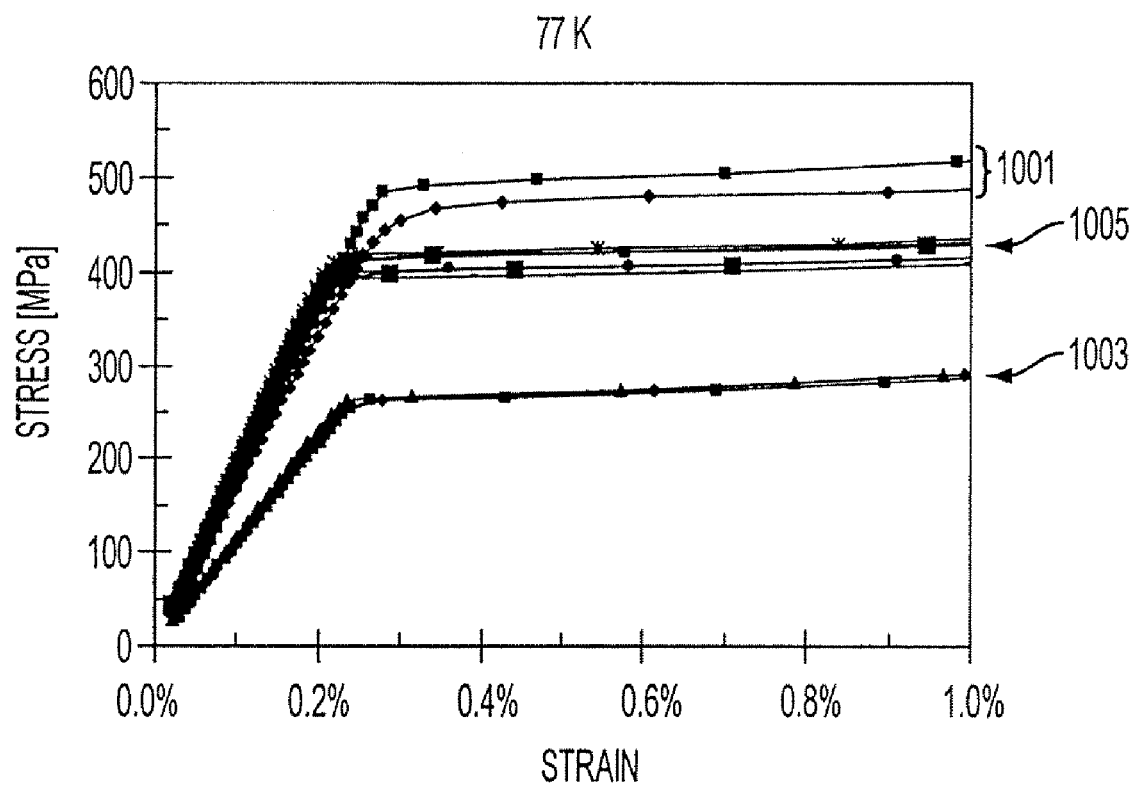

FIGS. 10A and 10B show exemplary stress-strain curves of the obtained bilayer composite substrate 71 (curves 1001), a single layer Ni-5 at % W (curves 1003), and a single layer Ni-9 at % W (curves 1005) substrates at room temperature (FIG. 10A) and at about 77 K (FIG. 10B). As shown, the composite substrate 71 has significantly improved mechanical properties at both temperatures. For example, the room temperature 0.02% yield strength is about 375 MPa, which is about double that of Ni-5 at % W (about 190 MPa). At about 77K, the 0.02% yield strength is about 480 MPa, which is also about double that of Ni-5 at % W (about 250 MPa)

Figure 11A:
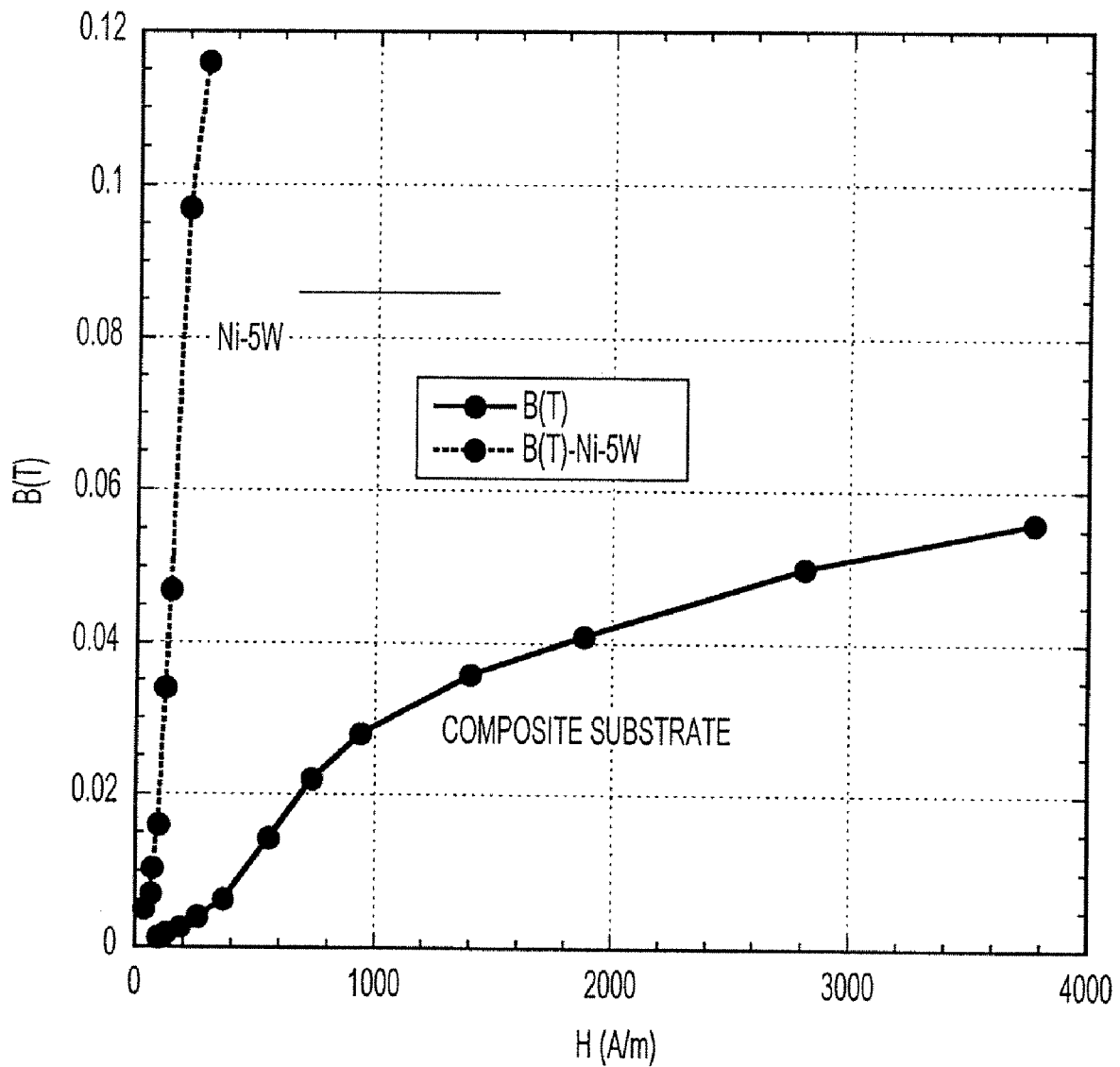
FIG. 11A shows the permeability measurement of the composite substrate 71 of FIG. 7 and Ni-5 at % W in accordance with certain embodiments of the present invention.
Figure 11B:
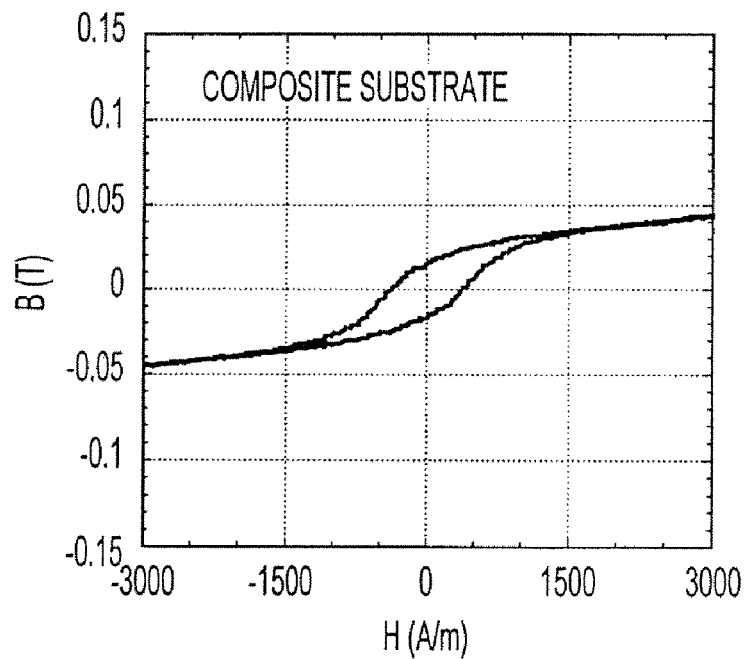
FIGS. 11B and 11C show the loss per cycle of the composite substrate 71 of FIG. 7 and a single Ni-5 at % W substrate in accordance with certain embodiments of the present invention.
Figure 11C:
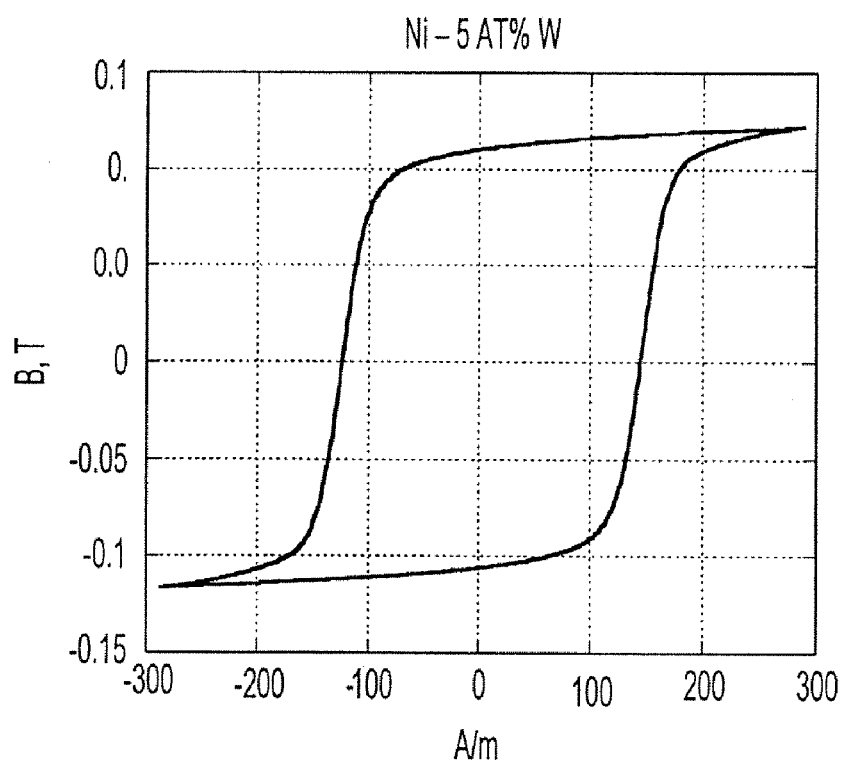

FIG. 11A shows the permeability measurement of the composite substrate 71 and Ni-5 at % W. As shown, the permeability of the composite substrate 71 was decreased by a factor of about 7. FIGS. 11B and 11C show the loss per cycle of the composite substrate 71 and Ni-5 at % W, which shows that the total loss per cycle remained similar for both substrates although $B_{coer}$ increased for the composite substrate 71. The measurements were conducted at about 77 K.

EXAMPLE 2

Figure 12A:
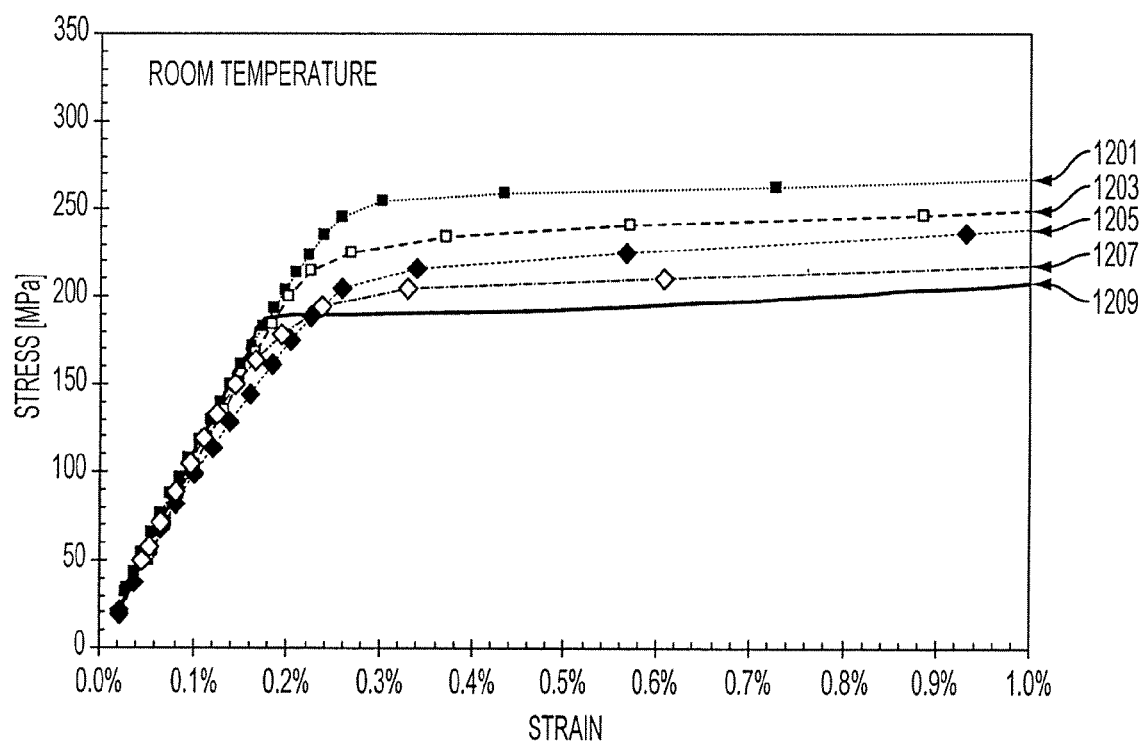
FIGS. 12A and 12B show the stress-strain curves of the composite substrate 71 of Example 2 and that of a single Ni-5 at % W substrate at room temperature and at 77K in accordance with certain embodiments of the present invention.
Figure 12B:
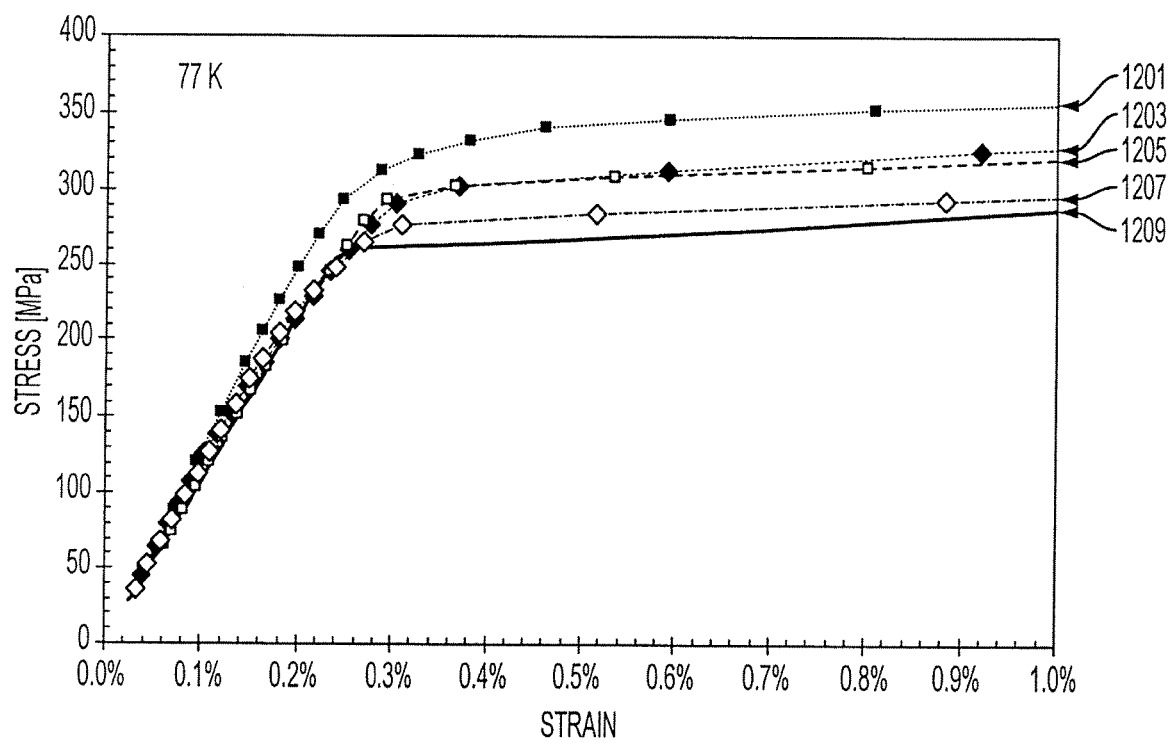
Figure 13A:
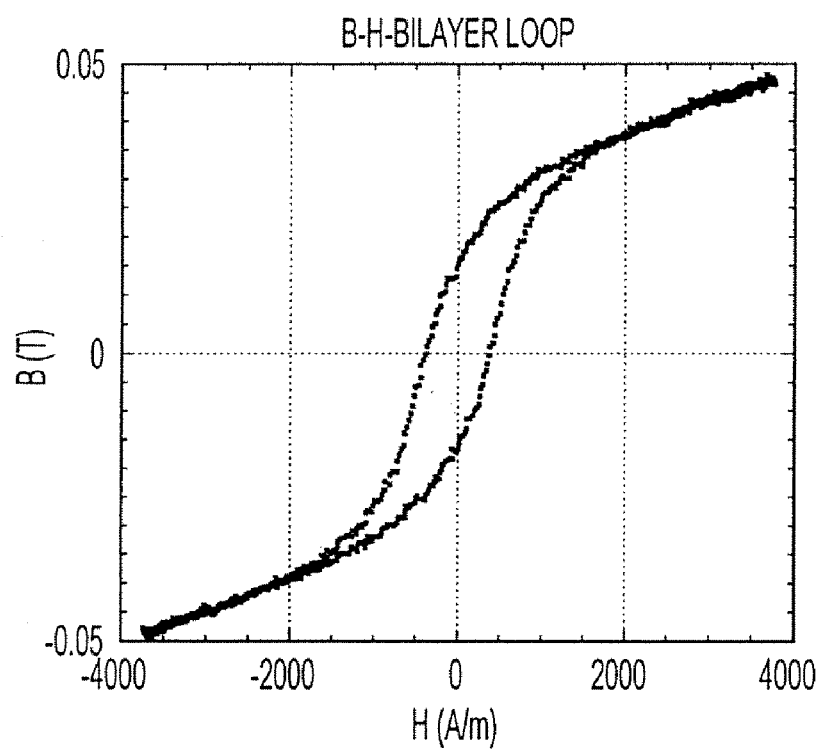
FIGS. 13A and 13B show the loss per cycle of the composite substrate 71 of Example 2 and a single Ni-5 at % W substrate in accordance with certain embodiments of the present invention.
Figure 13B:
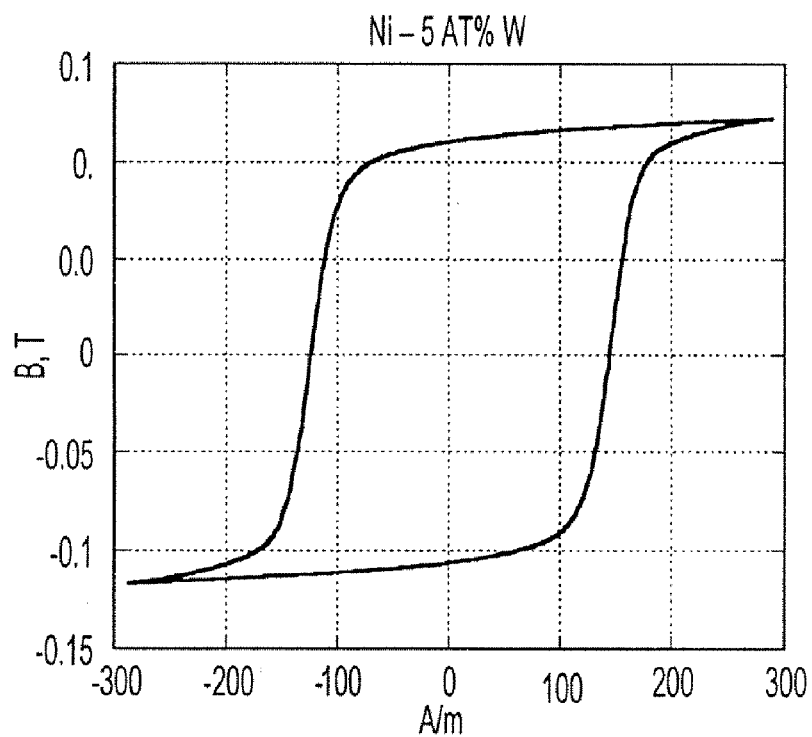

Composite substrate 71 was made as described in Example 1, except Ni-4 at % W alloys were utilized for sheath 703 and Ni-9.3 at % W were utilized as core 701. FIGS. 12A and 12B show the stress-strain curves of the composite substrate 71 of Example 2 (curves 1201, 1203, 1205, and 1207) and that of a single Ni-5 at % W substrate (curve 1209) at room temperature (FIG. 12A) and at 77K (FIG. 12B). As before, strength improved, but only at best about 30% more than that of the single-5 at % W. FIG. 13A also shows the loss per cycle of the composite substrate 71 of Example 2. As before, $B_{coer}$ increased while loss per cycle remain similar to that of the single Ni-5 at % W substrate (see FIG. 13B).

EXAMPLE 3

Other composite substrates having a bilayer or trilayer configuration were also made as described in Example 1. For the trilayer configuration, mixed powders for sheath 703 corresponding to about 20% of the total thickness of the composite substrate 71, mixed powders for core 701 corresponding to about 60% of the total thickness of the composite substrate 71, and mixed powders for sheath 703 corresponding to about 20% of the total thickness of the composite substrate 71 were loaded into the rectangular die and pressed to form the compacted green body. Various composite substrates were produced as shown in Table 1 below.

TABLE 1

Composite Substrates

| Sample | Compression (tons per square inch) | Bi/trilayer | Core composition (at %) | Thickness (inches) |
|---|---|---|---|---|
| 1 | 30 | Trilayer | Ni—6W—6Cr | 0.25 |
| 2 | 45 | Trilayer | Ni—6W—6Cr | 0.25 |
| 3 | 30 | Bilayer | Ni—9.5W | 0.15 |
| 4 | 45 | Bilayer | Ni—9.5W | 0.15 |
| 5 | 30 | Trilayer | Ni—5W—6Mo | 0.25 |
| 6 | 45 | Trilayer | Ni—5W—6Mo | 0.25 |
| 7 | 30 | Bilayer | Ni—5W—6Mo | 0.15 |
| 8 | 45 | Bilayer | Ni—5W—6Mo | 0.15 |

Upon review of the description and embodiments of the present invention, those skilled in the art will understand that modifications and equivalent substitutions may be performed in carrying out the invention without departing from the essence of the invention. Thus, the invention is not meant to be limiting by the embodiments described explicitly above, and is limited only by the claims which follow.

The invention claimed is:

1. A composite substrate comprising:
   a first layer comprising a metal alloy having a cube texture on at least a portion of a surface of said first layer; and
   a second layer comprising a nickel-tungsten-molybdenum alloy comprising about 2 to 10 atomic percent tungsten and 2 to 15 atomic percent molybdenum;
   wherein said nickel-tungsten-molybdenum alloy has a higher yield strength than said metal alloy.

2. The composite substrate of claim 1, wherein said nickel-tungsten-molybdenum alloy comprises about 5 atomic percent tungsten and about 6 atomic percent molybdenum.

3. The composite substrate of claim 1, wherein said first layer comprises a nickel-tungsten alloy comprising up to about 6 atomic percent tungsten.

4. The composite substrate of claim 3, wherein said first layer comprises a nickel-tungsten alloy comprising about 4 to 5 atomic percent tungsten.

5. The composite substrate of claim 1, wherein said first layer comprises a nickel-molybdenum alloy comprising up to about 7 atomic percent molybdenum.

6. The composite substrate of claim 1, wherein said first layer comprises a nickel-tungsten-molybdenum alloy comprising up to about 6 atomic percent tungsten and up to about 7 atomic percent molybdenum.

7. The composite substrate of claim 1, wherein at least about 90% of the surface of said first layer comprises a cube texture.

8. The composite substrate of claim 1, wherein
   said first layer is about 5-50% of the total thickness of said composite substrate; and
   said second layer is about 50-95% of the total thickness of said composite substrate.

9. The composite substrate of claim 1, wherein said second layer further comprises tungsten and/or molybdenum metal particles.

10. The composite substrate of claim 1, further comprising a third layer, wherein said second layer is disposed between said first layer and said third layer, said third layer comprising a metal alloy.

11. The composite substrate of claim 10, wherein said third layer comprises a nickel-tungsten alloy comprising up to about 6 atomic percent tungsten.

12. The composite substrate of claim 11, wherein said third layer comprises a nickel-tungsten alloy comprising about 4 to 5 atomic percent tungsten.

13. The composite substrate of claim 12, wherein said nickel-tungsten-molybdenum alloy comprises about 5 atomic percent tungsten and about 6 atomic percent molybdenum.

14. The composite substrate of claim 13, wherein said first layer comprises a nickel-tungsten alloy comprising up to about 6 atomic percent tungsten.

15. The composite substrate of claim 10, wherein at least about 90% of the surface of said first layer comprises a cube texture.

16. A composite substrate comprising:
a first layer comprising a nickel-tungsten alloy having a cube texture on at least a surface of said first layer and having up to about 6 atomic percent tungsten;
a second layer comprising a nickel-tungsten-molybdenum alloy having about 2-10 atomic percent tungsten and about 2-15 atomic percent tungsten; and
an interdiffusion zone between said first layer and said second layer.

17. The composite substrate of claim 16, wherein
said nickel-tungsten alloy comprises about 4 to 5 atomic percent tungsten; and
said nickel-tungsten-molybdenum alloy comprises about 5 atomic percent tungsten and 6 atomic percent molybdenum.

18. The composite substrate of claim 16, further comprising:
a third layer comprising a nickel-tungsten alloy having up to about 6 atomic percent tungsten; and
a second interdiffusion zone between said second layer and said third layer.

19. The composite substrate of claim 18, wherein
said nickel-tungsten alloy comprises about 4 to 5 atomic percent tungsten; and
said nickel-tungsten-molybdenum alloy comprises about 5 atomic percent tungsten and 6 atomic percent molybdenum.

* * * * *